US012568659B2

(12) United States Patent
Luo et al.

(10) Patent No.: US 12,568,659 B2
(45) Date of Patent: Mar. 3, 2026

(54) FABRICATION METHOD FOR SEMICONDUCTOR STRUCTURE

(71) Applicant: Institute of Semiconductors, Chinese Academy of Sciences, Beijing (CN)

(72) Inventors: Junwei Luo, Beijing (CN); Jiaxin Xiong, Beijing (CN); Yang Liu, Beijing (CN); Shan Guan, Beijing (CN); Shushen Li, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 378 days.

(21) Appl. No.: 18/322,815

(22) Filed: May 24, 2023

(65) Prior Publication Data

US 2023/0299185 A1     Sep. 21, 2023

Related U.S. Application Data

(63) Continuation of application No. PCT/CN2022/074806, filed on Jan. 28, 2022.

(51) Int. Cl.
| | |
|---|---|
| *H10D 48/00* | (2025.01) |
| *G06N 10/40* | (2022.01) |
| *H10D 62/40* | (2025.01) |
| *H10D 62/822* | (2025.01) |

(52) U.S. Cl.
CPC .......... *H10D 48/383* (2025.01); *G06N 10/40* (2022.01); *H10D 48/3835* (2025.01); *H10D 62/405* (2025.01); *H10D 62/822* (2025.01)

(58) Field of Classification Search
CPC ..... H10D 48/383–3835; H10D 48/385; H10D 62/405; H10D 62/832
See application file for complete search history.

(56) References Cited

U.S. PATENT DOCUMENTS 11,133,388 B1     9/2021 Joynt et al.

FOREIGN PATENT DOCUMENTS

| | | |
|---|---|---|
| CN | 103140930 A | 6/2013 |
| CN | 109873028 A | 6/2019 |
| CN | 113299808 A | 8/2021 |

OTHER PUBLICATIONS

Zhang Jieyin, Gao Fei, Zhang Jianjun "Research Progress on Silicon and Fault-Based Quantum Computing Materials" Journal of Physics, vol. 70, No. 21 (2021) p. 217802.*
International Search Report issued for corresponding international patent application PCT/CN2022/074806, mailed Oct. 27, 2022 (12 pages).

(Continued)

*Primary Examiner* — Amar Movva
(74) *Attorney, Agent, or Firm* — Osha Bergman Watanabe & Burton LLP

(57) ABSTRACT
A fabrication method for a semiconductor structure with a hole spin qubit includes: providing a substrate; growing a germanium quantum well on the substrate, in which the germanium quantum well is an inclined quantum well structure grown in a [110] direction, and the germanium quantum well is grown by a complementary metal oxide semiconductor process; and fabricating a two-dimensional gate-defined quantum dot in the germanium quantum well.

20 Claims, 3 Drawing Sheets

(56) References Cited

OTHER PUBLICATIONS

Written Opinion issued for corresponding international patent application No. PCT/CN2022/074806, mailed Oct. 27, 2022 (14 pages).
Zhang Jie-Yin et al., "Research progress of silicon and germanium quantum computing materials;" Journal of Physics, Oct. 13, 2021, No. 21, vol. 170 (13 pages).

* cited by examiner

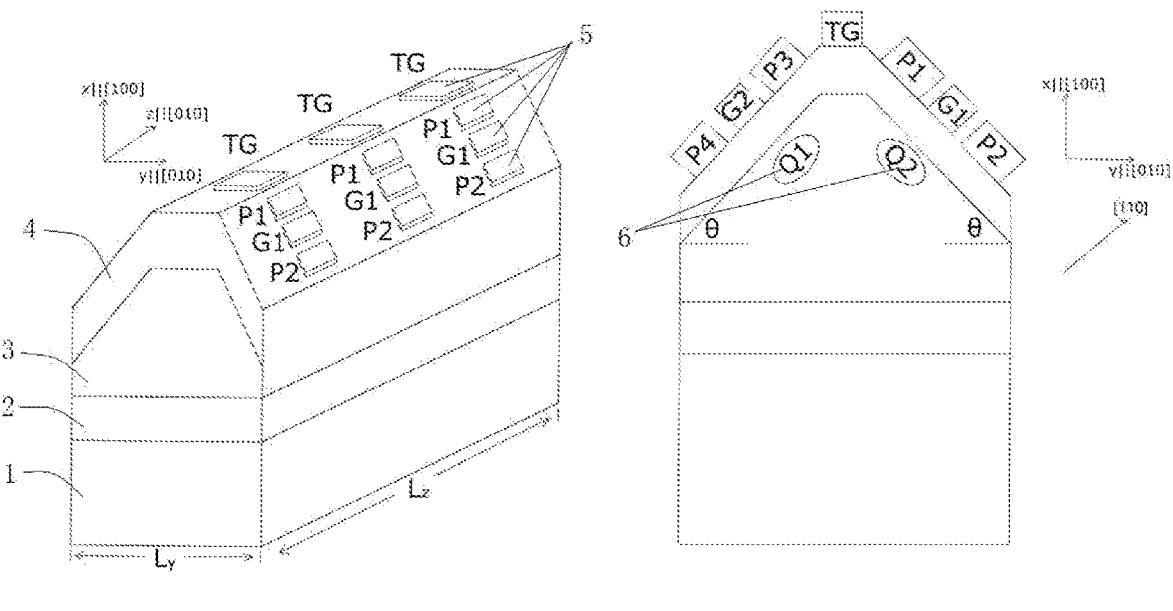
Fig. 1a                  Fig. 1b
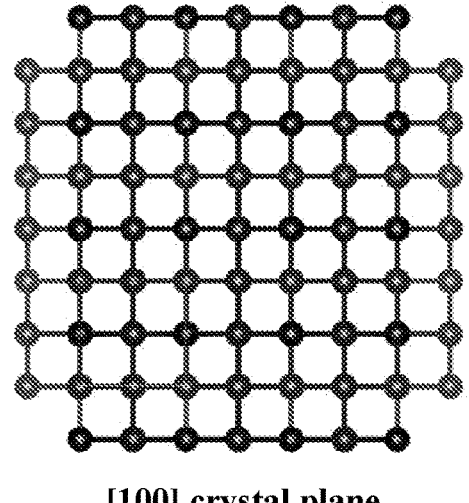
[100] crystal plane
Fig. 2a
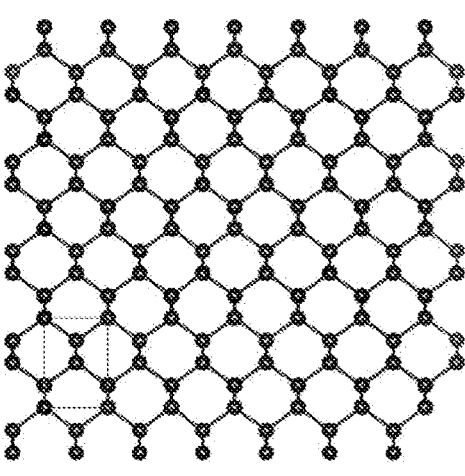
[110] crystal plane
Fig. 2b

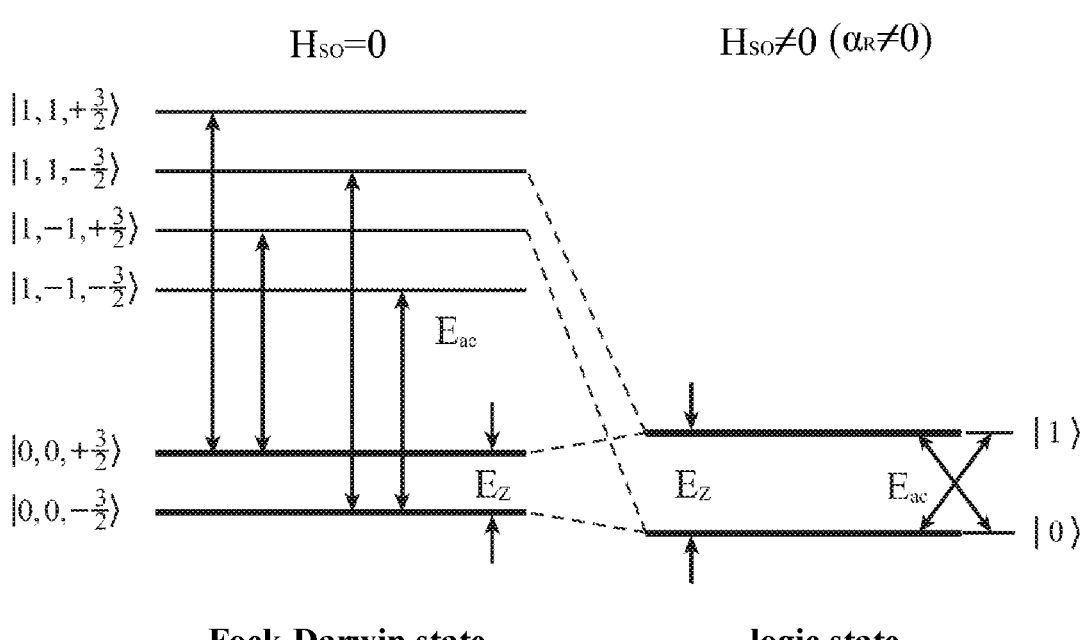
Fig. 3
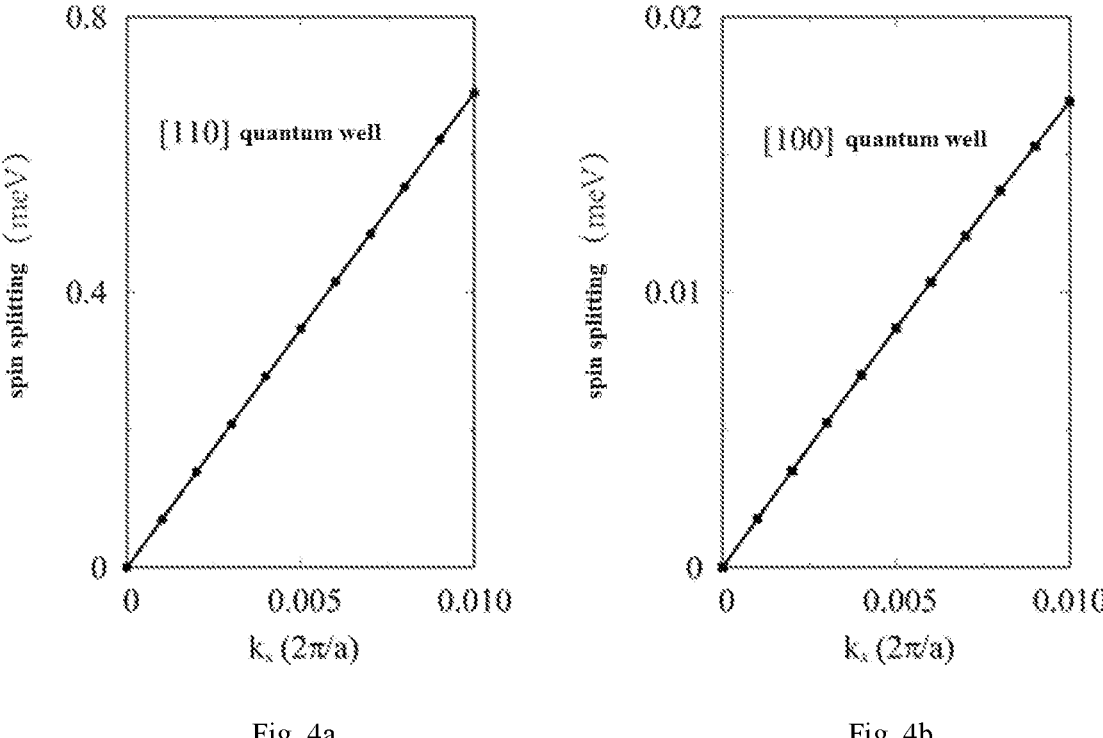
Fig. 4a                                    Fig. 4b

FABRICATION METHOD FOR SEMICONDUCTOR STRUCTURE

CROSS-REFERENCE TO RELATED APPLICATION

This application is a continuation of International Patent Application No. PCT/CN2022/074806 filed on Jan. 28, 2022, the entire contents of which are incorporated herein by reference for all purposes.

FIELD

The present disclosure relates to the field of semiconductor technology, and relates to a semiconductor structure and a fabrication of a semiconductor structure.

BACKGROUND

In recent years, a semiconductor gate-defined quantum dot as a platform for hole spin qubits has attracted much attention due to its deep compatibility with a mature microelectronic CMOS process. To realize the electrical control of hole spin in a two-dimensional gate-defined germanium quantum dot system, the electric dipole spin resonance (EDSR) technique is needed. The realization of the EDSR technique in the two-dimensional gate-defined germanium quantum dot depends on the linear Rashba spin-orbit coupling effect or the cubic Dresselhaus spin-orbit coupling effect, but there is no Dresselhaus effect in germanium due to the existence of bulk inversion symmetry. Since a linear Rashba effect is found in germanium driving fast EDSR, it is quite necessary to provide a method for fabricating semiconductor structure with a fast spin inversion rate and a high-quality spin qubit.

SUMMARY

In an aspect, embodiments of the present disclosure provide a fabrication method for a semiconductor structure. The fabrication method includes providing a substrate, growing a germanium quantum well on the substrate, in which the germanium quantum well is an inclined quantum well structure grown in a [110] direction, and the germanium quantum well is grown by the CMOS process, and fabricating a two-dimensional gate-defined quantum dot in the germanium quantum well.

In some embodiments, growing the germanium quantum well on the substrate includes growing an alloy layer on the substrate, growing a [100] germanium layer on the alloy layer, in which the germanium layer is p-type doped, and growing an inclined plane by etching the [100] germanium layer.

In some embodiments, the fabrication method further includes growing a dielectric layer on the germanium layer, and growing an electrode on the dielectric layer.

In some embodiments, the inclined plane is inclined at an angle of 45 degrees to a horizontal direction.

In some embodiments, a diameter of the two-dimensional gate-controlled quantum dot is 60 to 100 nm.

In some embodiments, the substrate is a [100] silicon substrate.

In some embodiments, the alloy layer is a [100] germanium-silicon alloy layer, a thickness of the [100] germanium-silicon alloy layer ranges from 1 nm to 100 nm, and a percentage of silicon in the [100] germanium-silicon alloy layer is less than 50%.

In some embodiments, a thickness of the [100] germanium layer is in a range of 10 to 1000 nm. In some embodiments, a dielectric material of the dielectric layer is $SiO_2$ or $Al_2O_3$, and a thickness of the dielectric layer is between 10 nm and 100 nm.

In some embodiments, the electrode is a metal electrode, a material of the metal electrode is Al or Au, and a thickness of the metal electrode is in a range of 10 to 100 nm.

In some embodiments, the [100] germanium layer is p-type doped by a method including thermal diffusion, electrochemical implantation, or ion implantation.

In some embodiments, a bulk phase of the germanium material of the germanium quantum well is a crystal structure with a tetrahedral covalent bond.

In some embodiments, a mobility of the germanium quantum well reaches a level of $10^5$ cm$^2$/(V·s).

In some embodiments, the two-dimensional gate-defined quantum dot has the hole spin Rabi frequency of a level of GHz, and a quality factor of greater than $10^4$.

In some embodiments, the two-dimensional gate-defined quantum dot is fabricated in the germanium quantum well by an electric dipole spin resonance technique.

In some embodiments, a back gate static electric field, an in-inclined plane alternating electric field or microwave, an inclined plane perpendicular electrostatic field and an in-inclined plane or inclined plane perpendicular static magnetic field are applied to the germanium quantum well to generate the Rabi frequency, in which a direction of the in-inclined plane static magnetic field is not perpendicular to the direction of the in-inclined plane alternating electric field or microwave.

In some embodiments, a frequency of the in-inclined plane alternating electric field or microwave is equal to an intrinsic frequency of the in-inclined plane or inclined plane perpendicular static magnetic field.

In another aspect, embodiments of the present disclosure provide a semiconductor structure. The semiconductor structure includes a substrate, a germanium quantum well grown on the substrate, in which the germanium quantum well is an inclined quantum well structure grown in a [110] direction, and a two-dimensional gate-defined quantum dot fabricated in the germanium quantum well.

In some embodiments, the semiconductor structure includes the substrate, an alloy layer, a [100] germanium layer, a dielectric layer and an electrode grown sequentially from bottom to top, the [100] germanium layer being P-doped to grow an inclined plane with respect to the [100] germanium layer.

In some embodiments, the inclined plane is inclined at an angle of 45 degrees to a horizontal direction.

In some embodiments, a size of the two-dimensional gate-controlled quantum dot is 60 to 100 nm.

In some embodiments, the substrate is a [100] silicon substrate.

In some embodiments, the alloy layer is a [100] germanium-silicon alloy layer, a thickness of the [100] germanium-silicon alloy layer ranges from 1 nm to 100 nm, and a percentage of silicon in the [100] germanium-silicon alloy layer is less than 50%.

In some embodiments, a thickness of the [100] germanium layer is in a range of 10 nm to 1000 nm.

In some embodiments, a dielectric material of the dielectric layer is $SiO_2$ or $Al_2O_3$, and a thickness of the dielectric layer is between 10 nm and 100 nm.

In some embodiments, the electrode is a metal electrode, a material of the metal electrode is Al or Au, and a thickness of the metal electrode is in a range of 10 to 100 nm.

In some embodiments, a bulk phase of the germanium material of the germanium quantum well is a crystal structure with a tetrahedral covalent bond.

Additional aspects and advantages of the present disclosure will be set forth in the following description, some of which will be apparent from the following description, or learned through the practice of the present disclosure.

BRIEF DESCRIPTION OF THE DRAWINGS

The above-mentioned and/or additional aspects and advantages of the present disclosure will be apparent and easily understood from the description of the embodiments below with reference to the accompanying drawings, in which:

FIG. 1a is a schematic diagram showing a three-dimensional structure of a [110] quantum well and a two-dimensional gate-defined quantum dot;

FIG. 1b is a schematic diagram showing a two-dimensional cross-section of a [110] quantum well and a two-dimensional gate-defined quantum dot;

FIG. 2a is a schematic diagram showing a [100] crystal plane;

FIG. 2b is a schematic diagram showing a [110] crystal plane;

FIG. 3 is a schematic diagram showing an electric dipole spin resonance (EDSR) driven by a linear Rashba spin-orbit coupling effect according to an embodiment of the present disclosure;

FIG. 4a is a schematic diagram showing spin splitting of a $[110]$-$(Ge)_{40}/(Si)_{20}$ quantum well at 30 kV/cm;

FIG. 4b is a schematic diagram showing spin splitting of a $[100]$-$(Ge)_{40}/(Si)_{20}$ quantum well at 30 kV/cm;

DETAILED DESCRIPTION

Figures 5A, 5B:
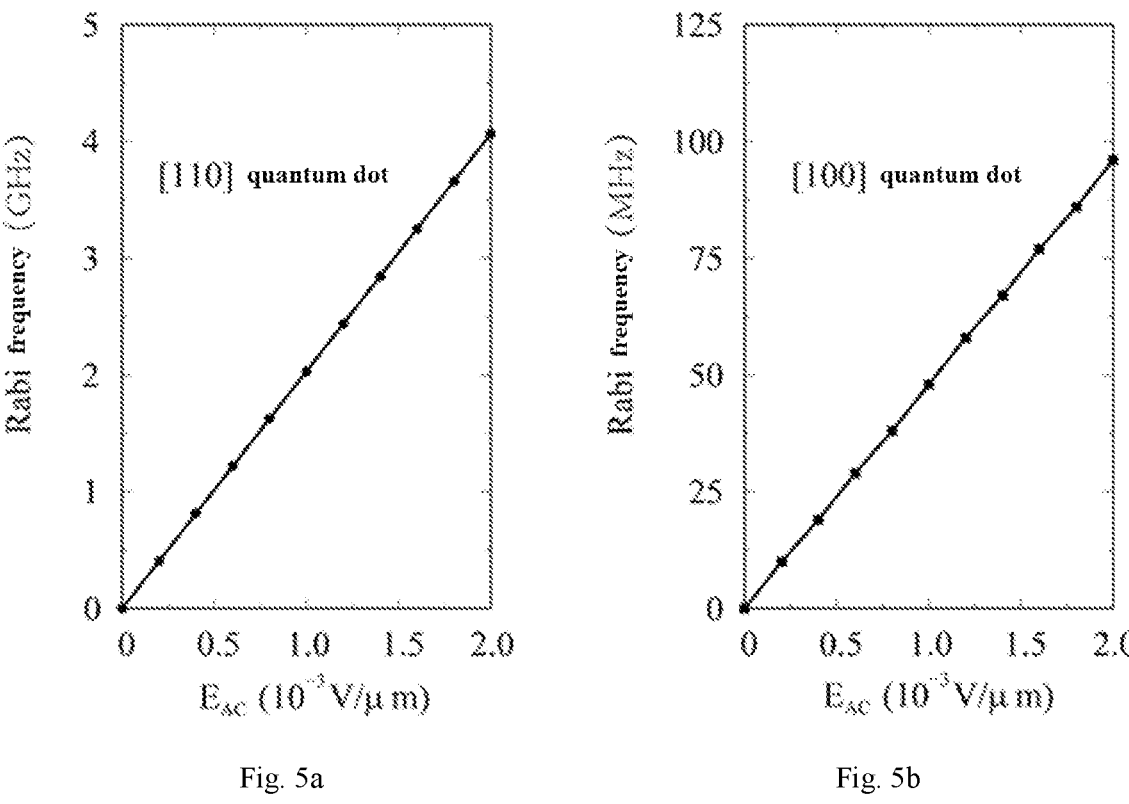
FIG. 5a is a schematic diagram showing a relationship of a Rabi frequency as a function of an alternating electric field or microwave of a [110] germanium quantum dot under an in-plane magnetic field of 1.65 T.
FIG. 5b is a schematic diagram showing a relationship of a Rabi frequency as a function of an alternating electric field or microwave of a [100] germanium quantum dot under an in-plane magnetic field of 1.65 T.

Embodiments of the present disclosure are described in detail below, examples of which are illustrated in the accompanying drawings. The embodiments described below with reference to the accompanying drawings are illustrative, and are intended to explain the present disclosure and cannot be construed as limiting the present disclosure.

It has been found that the hole spin of germanium has the following four advantages compared with the electron spin. Firstly, the hole has a p-type wave function, which greatly reduces the nuclear spin scattering, and germanium may further improve spin decoherence time by isotope purification. Secondly, germanium holes have a strong tunable spin-orbit coupling (SOC) effect, thus increasing the spin control rate. Thirdly, there is no valley degeneracy and valley scattering in the germanium holes. Fourthly, the germanium holes have a small effective mass, and the size of the quantum dot is inversely proportional to the effective mass when the two-dimensional static electric field is fixed, so that larger-sized gate-defined quantum dots can be fabricated, and it is easier to control the spin.

Rabi frequency is used to characterize the spin control rate. To realize the control of the hole spin in a two-dimensional gate-defined germanium quantum dot system, the electric dipole spin resonance (EDSR) technique is needed. Principles of the EDSR technique are as follows. Firstly, an out-of-plane or in-plane external static magnetic field is applied to the two-dimensional gate-defined quantum dot, so that Zeeman spin splitting occurs in an energy level, and spins on two splitting sub-energy levels of each energy level are reversed, parallel, or anti-parallel to a direction of the applied magnetic field. Secondly, an in-plane alternating electric field or microwave is applied to couple quantum states with the same spin in adjacent low-energy levels of the two-dimensional gate-defined quantum dot. Thirdly, an out-of-plane electrostatic field is applied to produce the linear Rashba spin-orbit coupling effect, which provides an electric dipole transition, and couples quantum states with different spins in adjacent low-energy levels to grow a two-level system with different spin states, thus generating spin resonance, in which each resonant spin state is a logic qubit.

Compared with the electron spin resonance (ESR) process, the EDSR technique of holes does not need to design a gradient micro-magnetic structure in a low-dimensional system to provide a magnetic field to make the spin flipped, but instead uses an equivalent magnetic field generated by the electrical controlled spin-orbit coupling effect. Instead of magnetic control, the electrical control further expands the application prospect of quantum computing of a semiconductor quantum dot with a hole spin as the platform.

The realization of the EDSR technique in the two-dimensional gate-defined germanium quantum dot depends on the linear Rashba spin-orbit coupling effect or the cubic Dresselhaus spin-orbit coupling effect, but there is no Dresselhaus effect in germanium due to the bulk inversion symmetry. In the past, it has always been considered that there is no linear Rashba effect in two-dimensional hole gas because there is no heavy-hole-light-hole coupling. However, recent studies have shown that there is a linear Rashba effect tunable by the electric field in quantum well grown in a [100] direction, which is caused by the heavy-hole-light-hole coupling at an interface. The effect is weak, but it can still produce a Rabi frequency of 100 MHz achieve fast spin manipulation. In order to realize faster spin manipulation, the germanium quantum well grown in the [110] direction is designed, and a method for fabricating the quantum well structure with such a crystal orientation is provided in the present disclosure, which helps the development of the quantum computing of the semiconductor quantum dot.

Accordingly, the present disclosure provides a fabrication method for a [110]-oriented germanium quantum well deeply compatible with the CMOS process. On this basis, a high-quality hole spin qubit of single and multiple two-dimensional gate-defined quantum dots may be fabricated, and a new solution for semiconductor quantum computing is provided.

It is found in the present disclosure that a strong spin-orbit coupling effect of a germanium quantum well hole may quickly drive spin flip of a gate-defined quantum dot qubit, and the group IV elements can provide a long spin decoherence time because the nuclear spin scattering is almost zero, and are deeply compatible with the microelectronic CMOS process, so a high-quality scalable spin qubit may be fabricated. However, spin qubits are still limited by slow spin control and short decoherence time. The core idea of the present disclosure is to fabricate a [110] quantum well and a gate-defined quantum dot by growing an inclined structure on a traditional quantum well, so as to improve the spin control rate, namely the Rabi frequency. Electric dipole spin resonance (EDSR) technique is used for holes, which involves quantum states having different spin components. Since an external alternating electric field or microwave may only cause coupling of quantum states having the same spin components, the Zeeman effect and the spin-orbit coupling (SOC) effect are inevitably introduced. Since the spin direction produced by the Zeeman effect is always parallel or antiparallel to the direction of an external static magnetic field, the spin-orbit coupling effect fundamentally provides the driving force for the spin flip. In the EDSR technique, when a frequency of the external alternating electric field or microwave is equal to an intrinsic frequency of the external static magnetic field, the spin state resonates and changes periodically with time, and the corresponding spin flip frequency is the Rabi frequency.

A main concern for the quantum computing is how to improve the Rabi frequency of the hole qubit, and for this concern a strong spin-orbit coupling effect is provided. The latest research shows that the linear Rashba spin-orbit coupling effect of the hole in the germanium quantum well is a source of fast spin manipulation. For a long time in the past, it was considered that there was no linear Rashba effect in the semiconductor quantum well hole system because there is no heavy-hole-light-hole coupling. The recent theoretical research shows that the linear Rashba effect is induced by the heavy-hole-light-hole coupling caused by the interface effect in a [100] germanium quantum well, and the linear Rashba effect in a [110] quantum well is one to two orders of magnitude larger than that in the [100] quantum well due to the existence of the intrinsic heavy-hole-light-hole coupling. The linear Rashba effect in the [100] quantum well successfully explains the Rabi frequency of the hole spin qubit in the [100] gate-controlled quantum dots, and the [110] quantum well with the stronger linear Rashba effect may provide the higher Rabi frequency for the qubit. However, due to various reasons, a high-quality [110] quantum well has not been successfully fabricated, let alone a high-quality [110] quantum dots qubit, which seriously hinders the further development of the semiconductor quantum computing.

The present disclosure, which is compatible with the existing mature microelectronic CMOS process, provides a solution for the fabrication of the [110] quantum well, and utilizes the strong linear Rashba spin-orbit coupling effect in the [110] quantum well to fabricate the high-quality hole spin qubit of the [110] gate-controlled quantum dot with the Rabi frequency in a level of GHz, which facilitates the development of the semiconductor quantum computing.

In the present disclosure, it is pointed out that the hole in the two-dimensional gate-defined [110] germanium quantum dot may provide the Rabi frequency reaching the level of GHz to realize the fabrication of the high-quality hole spin qubit. In the present disclosure, a method of obtaining a [110] crystal plane by using the inclined plane of 45 degree to the [100] direction is provided, which makes it feasible to grow the germanium quantum well in the [110] direction. The [110] germanium quantum well in the present disclosure is deeply compatible with the existing mature microelectronic CMOS process, and is expected to be used for large-scale integration of qubits.

The present disclosure will be further described in detail in combination with specific embodiments and with refer-ence to the accompanying drawings to make the purpose, technical solutions and advantages of the present disclosure more clear.

On the one hand, an embodiment of the present disclosure provides a fabrication method for a semiconductor structure with a high-quality hole spin qubit of a two-dimensional gate-controlled [110] quantum dot compatible with a CMOS process, which includes the following two steps.

I: An inclined germanium quantum well structure is fabricated based on the CMOS process, and growth of a germanium quantum well in a [110] direction is realized by controlling an inclined angle, in which a germanium quantum well structure is a p-type doped germanium quantum well.

II: Based on an electric dipole spin resonance (EDSR) technique, a two-dimensional gate-controlled quantum dot 6 is fabricated in the germanium quantum well structure to realize a high-quality hole spin qubit.

FIGS. 1a and 1b are schematic diagrams showing an inclined [110] germanium quantum well and a two-dimensional gate-defined [110] germanium quantum dot according to embodiments of the present disclosure. The fabrication method for the inclined [110] germanium quantum well includes steps S1 to S5.

In S1, a [100] germanium-silicon alloy layer 2 is grown on a [100] silicon substrate 1 to relieve lattice mismatch between germanium and silicon, in which a percentage of silicon in the germanium-silicon alloy layer $[100]-Ge_xSi_{1-x}$ should be less than 50%, and a thickness of the [100] germanium-silicon alloy layer 2 is ranging from several nanometers to tens of nanometers.

In S2, a [100] germanium layer 3 ranging from tens of nanometers to hundreds of nanometers is grown epitaxially on the [100] germanium-silicon alloy layer 2, and the [100] germanium layer 3 is P-doped by means of ion implantation and the like to obtain [100]-p-type Ge.

In S3, an inclined plane is grown by etching, such as dry etching or wet etching, the [100] germanium layer 3, and an inclined angle θ of the inclined plane is 45 degrees to a horizontal direction. The inclined angle of 45 degrees indicates that the germanium on the inclined plane of the quantum well is in a [110] crystal orientation, thus fabricating the [110] quantum well. FIG. 2a shows a schematic diagram of the [100] crystal orientation, and FIG. 2b shows a schematic diagram of the [110] crystal orientation.

In S4, a dielectric layer 4 is grown on the inclined plane of the quantum well. In some embodiments, a dielectric material of the dielectric layer 4 may be $SiO_2$ or $Al_2O_3$, and a thickness of the dielectric layer 4 ranges from ten nanometers to tens of nanometers.

In S5, a plurality of metal electrodes 5 is fabricated on the dielectric lay 4. In some embodiments, a material of the metal electrodes 5 may be Al or Au, and a thickness of the metal electrodes 5 is in a level of tens of nanometers. As shown in FIGS. 1a and 1b, the metal electrode 5 includes P1, P2, P3, P4, G1, G2 and TG electrodes, and the two-dimensional gate-controlled quantum dot 6 is shown as quantum dots Q1, and Q2, in which the P1, P2, P3 and P4 electrodes provide a constrained potential for trapping a two-dimensional hole, the G1 and G2 electrodes provide gate voltages for regulating the quantum dots Q1 and Q2 to generate and regulate the Rashba spin-orbit coupling effect, and the TG electrode provides the potential for separating or coupling the quantum dots Q1 and Q2.

In some embodiments, P1, P2, P3, P4, G1, G2, and TG electrodes are arranged in rows, and the number of electrodes in each row is equal. The left and right sides of the

[100] germanium layer 3 form opposite inclined planes, and a plane is formed between top ends of the two inclined planes. The dielectric layer 4 is grown with inclined planes and a plane grown therebetween, which are the same as those of the [100] germanium layer. The TG electrodes are all arranged on the top plane of the dielectric layer 4 in a longitudinal direction. The P1, G1, and P2 electrodes are distributed on an inclined plane at one side of the dielectric layer 4. The P3, G2, and P4 electrodes are distributed on an inclined plane at the other side of the dielectric layer 4. The G1 electrode is located between the P1 electrode and the P2 electrode, and the G1 electrode corresponds to the Q1 quantum dot. The G2 electrode is located between the P3 electrode and the P4 electrode, and the G2 electrode corresponds to the Q2 quantum dot. The Q1 quantum dot and the Q2 quantum dot are grown in the inclined planes of the [100] germanium layer.

In an inclined quantum well structure, a single qubit or double qubits may be generated in a y direction, and multiple qubits may be generated simultaneously in a z direction. Corresponding electrodes may be used to adjust a coupling strength between qubits according to different requirements. A size of the qubit is ranging from about tens of nanometers to 100 nanometers. Therefore, in some embodiments, the length $L_y$ in the y direction of the inclined plane quantum well structure may be between 800 nm to 1200 nm, and the length $L_z$ in the z direction may be freely adjusted as required.

The principle of the EDSR technique for control the hole spin qubit is shown in FIG. 3. An in-plane or out-of-plane static magnetic field is applied to the gate-defined quantum dot grown in the quantum well. Under the combined action of quantum confinement effect and Zeeman effect, spin-polarized discrete energy levels appear in the quantum dot. A quantum state corresponding to the discrete energy level is referred to as a Fock-Darwin state, which may be expressed by three quantum numbers, namely principal quantum number n, angular quantum number 1, and spin quantum number s, which is expressed as: |n,l,s>. The external alternating electric field or microwave may only couple adjacent quantum states having the same spin components. That is, it needs to satisfy $\Delta n=\pm 1$, and $\Delta s=0$ simultaneously. When there is no spin-orbit coupling effect, there is no coupling between quantum states having different spin components, so it is impossible to realize a spin regulation of a two-level system. When there is the linear Rashba spin-orbit coupling effect, it will cause the coupling between adjacent quantum states having different spin components. That is, it will satisfy $\Delta n=\pm 1$ and $\Delta s\neq 0$ simultaneously, thus forming the two-level system with different spin components in each energy level. The alternating electric field or microwave continuously couple the same spin components in the two-level system, thus constantly changing spin components of each energy level, and realizing time-dependent spin inversion and spin control.

Although the linear Rashba effect is the key to realize the spin control and the spin control by using the EDSR technique, it is generally considered in the past that there is only cubic Rashba effect and there is no linear Rashba effect for heavy holes of the quantum well due to the forbidden coupling between light and heavy holes. Recent studies show that there is heavy-hole-light-hole coupling in the quantum well, and thus the linear Rashba effect exists. The first-principle calculation results for spin splitting are shown in FIGS. 4a and 4b. When a vertical electric field with an strength of 30 kV/cm is applied, the Rashba spin splitting of each of the [110]-$(Ge)_{40}/(Si)_{20}$ quantum well and the [100]-

$(Ge)_{40}/(Si)_{20}$ quantum well near a F point shows a linear relationship with a wave vector, and a linear Rashba parameter ax of the [110]-$(Ge)_{40}/(Si)_{20}$ quantum well or the [100]-$(Ge)_{40}/(Si)_{20}$ quantum well is 30.7 meVÅ or 0.8 meVÅ, respectively. It can be easily found that the Rashba parameter in the [110] quantum well is two orders of magnitude larger than that in the [100] quantum well. This is because the heavy-hole-light-hole coupling in the [100] quantum well is only caused by the interface effect, and the heavy-hole-light-hole coupling in the [110] quantum well includes not only the part caused by the interface effect, but also the intrinsic heavy-hole-light-hole coupling caused by axial symmetry breaking in the specific orientation of the quantum well, so the strength of the heavy-hole-light-hole coupling in the [110] quantum well is much greater than that in the [100] quantum well, thus having a stronger linear Rashba effect.

It is worth noting that in order to eliminate the influence of Dresselhaus spin splitting caused by the alloy, a pure Si potential barrier is used. However, only GeSi alloy potential barrier may be grown in the experiment, because there is a 4% lattice mismatch between Ge and Si, so it is impossible to grow Ge directly on Si. The calculation shows the essence of the relationship of the magnitude of the Rashba effect, but it is still necessary to use GeSi alloy in the experiment.

The Rabi frequency is proportional to the linear Rashba parameter. So far, the reported growth direction of the quantum well and the two-dimensional gate-defined quantum dot are both [100] direction, and a maximum Rabi frequency is several hundred MHz. The [110] quantum dot designed in the present disclosure may obtain the Rabi frequency at the level of GHz. In some embodiments, a magnetic field of 1.65 T is applied in the plane of the quantum well, and the Rabi frequency is calculated as shown in FIGS. 5a and 5b. By adjusting the amplitude change of the alternating electric field or microwave at the gate voltage of 30 kV/cm, the Rabi frequency for the quantum dot in the [110] case is about 4 GHz, and the Rabi frequency for the quantum dot in the [100] case is about 100 MHz. In FIGS. 5a and 5b, a calculated quantum dot radius is 50 nm, and an in-plane g factor is 0.39. Effective masses of [110] and [100] quantum dots obtained from first principles are 0.135 and 0.132 electron masses, respectively.

Figure 6:
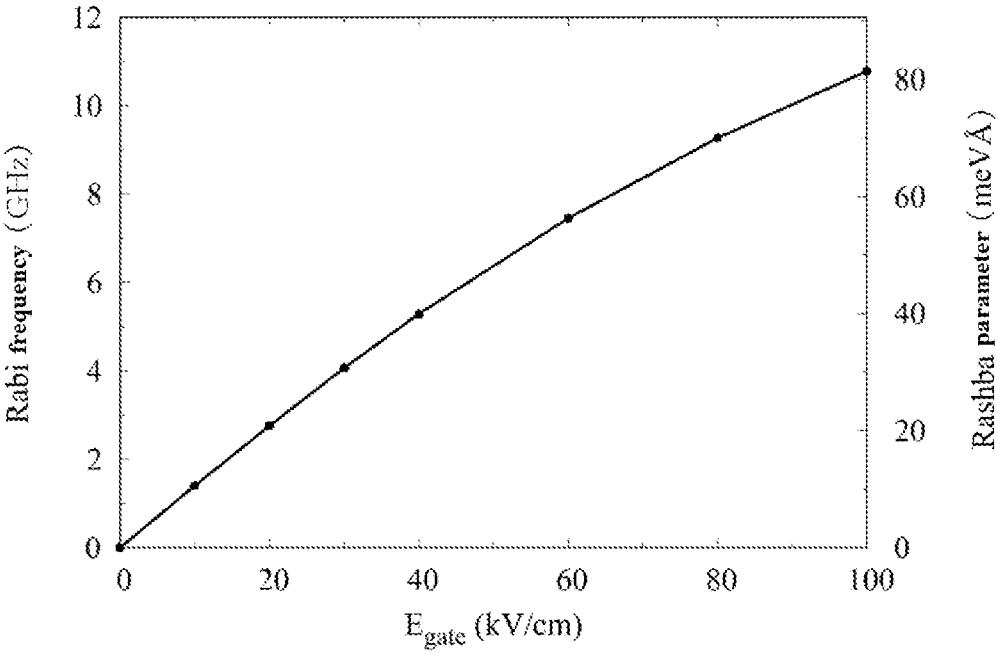
FIG. 6 is a schematic diagram showing a relationship of a Rabi frequency and a linear Rashba parameter as a function of a gate voltage of a [110] germanium quantum dot under an in-plane magnetic field of 1.65 T according to an embodiment of the present disclosure.

The theoretical calculations of FIGS. 4a, 4b, 5a, and 5b show that the [110] quantum well has a larger linear Rashba effect and Rabi frequency compared with the [100] quantum well. Since the linear Rashba effect may be regulated by the gate voltage, and the Rabi frequency can be regulated by the gate voltage. As shown in FIG. 6, the gate voltage changes in the range from 0 to 100 kV/cm, the linear Rashba parameter will reach 80 meVÅ, and the Rabi frequency will reach 11 GHz. A thickness of 40 germanium monoatomic layers in a calculated system is about 6 nm, and the Rabi frequency may be further improved by increasing the germanium layer thickness in a certain range.

To sum up, the present disclosure provides a fabrication solution of the semiconductor gate-controlled [110] germanium quantum dot with the high-quality hole spin qubit, which is compatible with the CMOS process. The [110] crystal plane quantum well is obtained by incline etching the [100] germanium layer, so as to realize the high quality gate-controlled quantum dot with the fast spin inversion.

In some embodiments, a diameter of the two-dimensional gate-controlled quantum dot 6 is 60 to 100 nm.

In some embodiments, the method for p-type doping includes thermal diffusion, electrochemical implantation, or ion implantation.

In some embodiments, a bulk phase of the germanium material of the germanium quantum well is a crystal structure with a tetrahedral covalent bond.

In some embodiments, physical vapor deposition and plasma chemical vapor deposition may be used in the fabrication method for the germanium quantum well.

In some embodiments, the method of growing the inclined surface by etching the [100] germanium layer 3 may include dry etching, and/or wet etching.

In some embodiments, a method for fabricating the metal electrode 5 includes electron beam exposure, and/or electron beam evaporation.

In some embodiments, a mobility of the germanium quantum well reaches a level of $10^5$ cm$^2$/(V·s).

In some embodiments, the two-dimensional gate-defined quantum dot 6 has the hole Rabi frequency of a level of GHz, and a quality factor of greater than $10^4$.

In some embodiments, the germanium quantum well is subjected to the quantum confinement effect in the [110] direction.

In some embodiments, the substrate is, but is not limited to, the silicon substrate.

In some embodiments, the inclined angle θ of the inclined plane of the quantum well is not limited to 45 degrees. When θ is 45 degrees, the crystal orientation on the inclined plane is [110] direction, which has the largest Rashba effect and Rabi frequency and is the most ideal situation. However, there may be errors or difficulties in strictly controlling the inclined angle of 45 degrees in the experiment, and a slight deviation of the inclined angle may also achieve the purpose of the present disclosure.

The EDSR technique requires that a back gate static electric field, an in-inclined plane alternating electric field or microwave, an inclined plane perpendicular electrostatic field and an in-inclined plane or inclined plane perpendicular static magnetic field are applied to the germanium quantum well to generate the Rabi frequency, in which the direction of the in-inclined plane static magnetic field is not perpendicular to the direction of the in-inclined plane alternating electric field or microwave. A frequency of the in-inclined plane alternating electric field or microwave is equal to an intrinsic frequency of the in-inclined plane or inclined plane perpendicular static magnetic field.

The germanium hole has the strong tunable spin-orbit coupling (SOC) effect, it is almost unaffected by nuclear spin scattering, the spin decoherence time can be improved by isotope purification, and the germanium hole is not affected by valley scattering. The germanium quantum dot has become an important support for the semiconductor quantum computing since it has the highest mobility among all known semiconductor materials, and is deeply compatible with traditional CMOS processes. The quantum well grown in the [110] direction has the largest linear Rashba spin-orbit coupling effect and may provide the fastest Rabi frequency compared with the traditional quantum well grown in the [100] direction. It is easier to grow the [110] quantum well directly on the plane by designing the inclined quantum well, which provides a new solution for realizing the high-quality hole spin qubit.

In another aspect, embodiments of the present disclosure provide a semiconductor structure, as shown in FIG. 1a and FIG. 1b. The semiconductor structure includes a [100] silicon substrate 1, a [100] germanium-silicon alloy layer 2, a [100] germanium layer 3, a dielectric layer 4 and a metal electrode 5 grown sequentially from bottom to top. The [100] germanium layer 3 is p-type doped to grow an inclined plane with respect to the [100] germanium layer 3, and a two-dimensional gate-defined quantum dot 6 is embedded in the inclined plane of the [100] germanium layer 3. The inclined angle θ of the inclined plane is 45 degrees to a horizontal direction.

In some embodiment, a size of the two-dimensional gate-controlled dot 6 is 60 to 100 nm.

In some embodiments, a thickness of the [100] germanium-silicon alloy layer 2 is ranging from several nanometers to tens of nanometers, and a percentage of silicon in the [100] germanium-silicon alloy layer 2 is less than 50%.

In some embodiments, a thickness of the [100] germanium layer 3 is in a range of tens of nanometers to hundreds of nanometers.

In some embodiments, a dielectric material of the dielectric layer 4 is SiO$_2$ or Al$_2$O$_3$, and a thickness of the dielectric layer 4 is between ten nanometers and tens of nanometers.

In some embodiments, a material of the metal electrode 5 is Al or Au, and a thickness of the metal electrode 5 is in the order of tens of nanometers.

In some embodiments, a bulk phase of the germanium material of the germanium quantum well is a crystal structure with a tetrahedral covalent bond.

In some embodiments, the substrate is, but is not limited to, the silicon substrate.

In some embodiments, the inclined angle θ of the inclined plane of the quantum well is not limited to 45 degrees. When θ is 45 degrees, the crystal orientation on the inclined plane is [110] direction, which has the largest Rashba effect and Rabi frequency, which is the most ideal situation. However, there may be errors or difficulties in strictly controlling the inclined angle of 45 degrees in the experiment, and a slight deviation of the inclined angle may also achieve the purpose of the present disclosure.

All the embodiments of the present disclosure may be executed separately, or in combination with other embodiments, which are regarded as the protection scope of the present disclosure.

Reference throughout the present disclosure to "an embodiment", "some embodiments", "an example", "a specific example", or "some examples", mean that a particular feature, structure, material, or characteristic described in connection with the embodiment or example is included in at least one embodiment or example of the present disclosure. The schematic expressions of the above-mentioned terms throughout this specification are not necessarily referring to the same embodiment or example. Moreover, the particular features, structures, materials, or characteristics described may be combined in any suitable manner in one or more embodiments or examples. In addition, those skilled in the art may combine the different embodiments or examples and features of different embodiments or examples described in this specification without being mutually inconsistent.

Although the embodiments of the present disclosure have been shown and described above, it is to be understood that the above embodiments are illustrative and cannot be construed as limiting the present disclosure, and those skilled in the art may make changes, modifications, substitutions, and variations to the above embodiments within the scope of the present disclosure.

What is claimed is:

1. A fabrication method for a semiconductor structure, comprising:

providing a substrate;

growing a germanium quantum well on the substrate, wherein the germanium quantum well is an inclined quantum well structure grown in a [110] direction, and the germanium quantum well is grown by a complementary metal oxide semiconductor process; and fabricating a two-dimensional gate-defined quantum dot in the germanium quantum well.

2. The fabrication method of claim 1, wherein growing the germanium quantum well on the substrate comprises:

growing an alloy layer on the substrate;

growing a [100] germanium layer on the alloy layer, wherein the [100] germanium layer is p-type doped; and growing an inclined plane by etching the [100] germanium layer.

3. The fabrication method of claim 2, further comprising:

growing a dielectric layer on the [100] germanium layer; and growing an electrode on the dielectric layer.

4. The fabrication method of claim 3, wherein a dielectric material of the dielectric layer is $SiO_2$ or $Al_2O_3$, and a thickness of the dielectric layer is between 10 nm and 100 nm.

5. The fabrication method of claim 3, wherein the electrode is a metal electrode, a material of the metal electrode is Al or Au, and a thickness of the metal electrode is in a range of 10 to 100 nm.

6. The fabrication method of claim 2, wherein the inclined plane is inclined at an angle of 45 degrees to a horizontal direction.

7. The fabrication method of claim 2, wherein the alloy layer is a [100] germanium-silicon alloy layer, a thickness of the [100] germanium-silicon alloy layer is ranging from 1 nm to 100 nm, and a percentage of silicon in the [100] germanium-silicon alloy layer is less than 50%.

8. The fabrication method of claim 2, wherein a thickness of the [100] germanium layer is in a range of 10 to 1000 nm.

9. The fabrication method of claim 2, wherein the [100] germanium layer is P-doped by a method comprising thermal diffusion, electrochemical implantation, or ion implantation.

10. The fabrication method of claim 1, wherein a size of the two-dimensional gate-controlled quantum dot is 60 to 100 nm.

11. The fabrication method of claim 1, wherein the substrate is a [100] silicon substrate.

12. The fabrication method of claim 1, wherein a bulk phase of the germanium material of the germanium quantum well is a crystal structure with a tetrahedral covalent bond.

13. The fabrication method of claim 1, wherein a mobility of the germanium quantum well reaches a level of $10^5$ $cm^2/(V \cdot s)$.

14. The fabrication method of claim 1, wherein the two-dimensional gate-defined quantum dot has a Rabi frequency of a level of GHz, and a quality factor of greater than $10^4$.

15. The fabrication method of claim 1, wherein the two-dimensional gate-defined quantum dot is fabricated in the germanium quantum well by an electric dipole spin resonance technique.

16. The fabrication method of claim 1, wherein a back gate static electric field, an in-inclined plane alternating electric field or microwave, an inclined plane perpendicular electrostatic field and an in-inclined plane or inclined plane perpendicular static magnetic field are applied to the germanium quantum well to generate a Rabi frequency, wherein a direction of the in-inclined plane static magnetic field is not perpendicular to a direction of the in-inclined plane alternating electric field or microwave.

17. The fabrication method of claim 16, wherein a frequency of the in-inclined plane alternating electric field or microwave is equal to an intrinsic frequency of the in-inclined plane or inclined plane perpendicular static magnetic field.

18. A semiconductor structure, comprising:

a substrate;

a germanium quantum well grown on the substrate, wherein the germanium quantum well is an inclined quantum well structure grown in a [110] direction; and a two-dimensional gate-defined quantum dot fabricated in the germanium quantum well.

19. The semiconductor structure of claim 18, comprising the substrate, an alloy layer, a [100] germanium layer, a dielectric layer and an electrode grown sequentially from bottom to top, the [100] germanium layer being p-type doped to grow an inclined plane with respect to the [100] germanium layer.

20. The semiconductor structure of claim 18, wherein the inclined plane is inclined at an angle of 45 degrees to a horizontal direction.

* * * * *